United States Patent [19]

Hutson

[11] 3,996,601
[45] Dec. 7, 1976

[54] SHORTING STRUCTURE FOR MULTILAYER SEMICONDUCTOR SWITCHING DEVICES

[76] Inventor: Jerald L. Hutson, P.O. Box 34235, Dallas, Tex. 75234

[22] Filed: Apr. 16, 1975

[21] Appl. No.: 568,470

Related U.S. Application Data

[63] Continuation-in-part of Ser. No. 488,789, July 15, 1974.

[52] U.S. Cl. .................................. 357/39; 357/20; 357/55; 357/57; 357/86
[51] Int. Cl.² ........................................ H01L 29/747
[58] Field of Search ................ 357/20, 38, 39, 86, 357/55, 57

[56] References Cited

UNITED STATES PATENTS

| | | | |
|---|---|---|---|
| 3,317,746 | 5/1967 | Hutson | 357/39 |
| 3,475,666 | 10/1969 | Hutson | 257/39 |
| 3,671,821 | 6/1972 | Nakata et al. | 357/38 |
| 3,812,405 | 5/1974 | Clark | 357/38 |

FOREIGN PATENTS OR APPLICATIONS

| | | | |
|---|---|---|---|
| 1,384,940 | 12/1963 | France | 357/38 |
| 923,104 | 4/1963 | United Kingdom | 357/39 |

*Primary Examiner*—Michael J. Lynch
*Assistant Examiner*—Joseph E. Clawson, Jr.
*Attorney, Agent, or Firm*—Richards, Harris and Medlock

[57] ABSTRACT

The specification discloses a semiconductor switch having a body formed from at least five layers of alternating first and second types of semiconductor material. A pair of regions of the first type of semiconductor material are formed on an outer surface of the body and are spaced apart by a pair of regions of the second type of semiconductor material. Electrodes contact the regions and form a gate and an anode. An electrode contacts the other outer surface of the body to form a second anode. Structure is provided for electrically connecting at least one of the regions with an intermediate layer which is interior within the body and is not immediately adjacent the regions. This shorting structure increases the switching speed of the device and improves the commutating and static dv/dt capabilities of the device.

13 Claims, 5 Drawing Figures

SHORTING STRUCTURE FOR MULTILAYER SEMICONDUCTOR SWITCHING DEVICES

RELATED APPLICATIONS

This application is a continuation-in-part of Ser. No. 488,789, filed July 15, 1974, and entitled "Multilayer Semiconductor Switching Devices".

FIELD OF THE INVENTION

This invention relates to semiconductor switches and more particularly relates to shorting structure for multilayer semiconductor switching devices.

THE PRIOR ART

A symmetrical switch for providing bidirectional switching is commonly termed a triac and has heretofore generally comprised five layers of alternating semiconductor types. Four of the layers have been utilized for switching or conducting during one-half cycle of an A.C. voltage source, and three of these same layers and a fifth layer are used for conducting during the alternate half cycle of the voltage source. Descriptions of the construction and operation of such five layer triac devices may be found in U.S. Pat. No. 3,275,909, issued Sept. 27, 1966 to F. W. Gutzwiller and U.S. Pat. No. 3,317,746, issued May 2, 1967 and U.S. Pat. No. 3,475,666, issued Oct. 28, 1969 to the present applicant.

Improved multilayer symmetrical semiconductor switches have been heretofore described in co-pending patent application Ser. No. 488,789, filed July 15, 1974, and entitled "Multilayer Semiconductor Switching Devices". The preferred embodiment of these improved switching devices has included at least seven layers of alternating types of semiconductor material to form a three terminal semiconductor switch which provides operating characteristics somewhat similar to prior triacs. However, such improved seven layer switches have improved voltage capacity and improved commutating and static dv/dt characteristics over conventional triac devices. With such improved multilayer switching devices, it is desirable to provide shorting between intermediate layers and external highly doped layers in order to provide improved switching operation. The present invention describes various techniques for providing such shorting structure.

SUMMARY OF THE INVENTION

In accordance with the present invention, a semiconductor switch includes a body having a plurality of layers of alternating first and second types of semiconductor material. A pair of regions of the first type of semiconductor material is formed on an outer surface of the body and is spaced apart by a pair of regions of the second type of semiconductor material. Electrodes contact the regions to form a gate and an anode. Structure is provided to electrically connect at least one of the regions with one of the intermediate layers which is interior within the body and is not immediately adjacent the regions. In the preferred embodiment, such structure includes small dimensioned extensions of the intermediate layer which extend through the layer immediately adjacent the regions into contact with the regions.

In accordance with another aspect of the invention, a semiconductor switch includes a body formed from a plurality of alternating layers of first and second types of semiconductor material. A first one of the outer layers is comprised of the first type of semiconductor material. A first pair of highly doped regions of the first type of semiconductor material is formed on the first outer layer of the body. The first pair of regions is spaced apart by a second pair of highly doped regions of the second type of semiconductor material formed on the first outer layer. At least one extension of an intermediate layer of the second type of semiconductor material extends through the first outer layer to contact one of the pair of highly doped regions of the second type of semiconductor material. This structure improves the switching speed and static dv/dt and commutating capabilities of the switch.

In accordance with another aspect of the invention, a semiconductor switch includes a body formed from at least five layers of alternating first and second types of semiconductor material. The body has first and second outer layers of the first conductivity material. A pair of regions of the first type of semiconductor material is formed on the first outer layer and is spaced apart by a pair of regions of the second type of semiconductor material. A region of the first type of semiconductor material is formed adjacent a region of the second type of semiconductor material on the second outer layer. Electrodes contact the regions to form a three terminal switching device. Extensions of the second type of semiconductor material extend from interior layers of the second type of semiconductor material through the first and second outer layers into contact with the regions.

DESCRIPTION OF THE DRAWINGS

For a more complete understanding of the present invention and for further objects and advantages thereof, reference is now made to the following description taken in conjunction with the accompanying Drawings, in which.

DESCRIPTION OF THE PREFERRED EMBODIMENT

Figure 1:
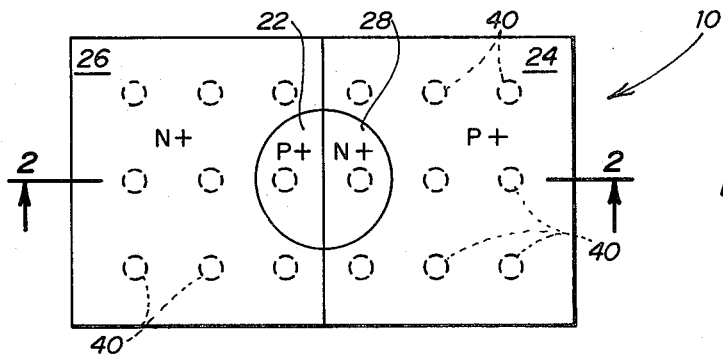
FIG. 1 is a top view of the preferred embodiment of the invention illustrating a plurality of shorting columns formed within the device.
Figure 2:
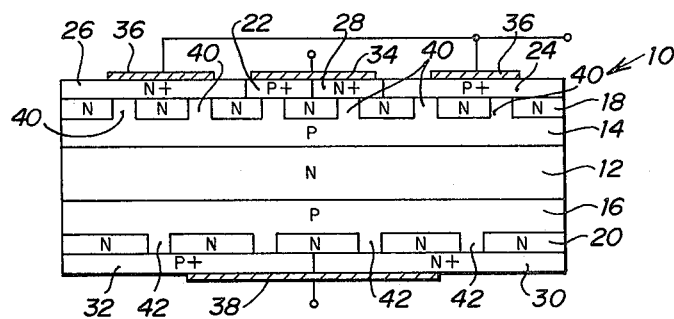
FIG. 2 is a cross-sectional view of FIG. 1 taken generally along the section lines 2—2.

Referring to FIGS. 1 and 2, a semiconductor body 10 may be seen to comprise a center layer 12 of N-type conductivity semiconductor material. P-type layers 14 and 16 are disposed on either side of layer 12. Outer layers 18 and 20 are formed of N-type material. It may thus be seen that body 10 comprises five layers of alternating types of semiconductor material. A pair of P+ regions 22 and 24 is formed on the exterior surface of the N-type layer 18. Regions 22 and 24 are spaced apart by regions 26 and 28 which are formed from N+ type semiconductor material. An N+ region 30 and a P+ region 32 are formed on the exterior surface of the outer layer 20. The body 10 may thus be termed a seven layer semiconductor device.

An electrode 34 contacts P+ region 22 and N+ region 28 to form a gate electrode. An electrode 36, which may comprise a ring electrode, contacts the N+ region 26 and the P+ region 24 to form a first anode terminal. An electrode 38 contacts the N+ region 30 and the P+ region 32 to form a second anode terminal.

An important aspect of the present invention is that small dimensioned extensions 40 of P-type material extend from the P layer 14 through the N-type layer 18 into contact with regions 22, 24, 26 and 28. As shown in FIG. 1, the extensions 40 in the preferred embodiment have a generally circular cross-section and have dimensions substantially less than the width of the body 10. Although the extensions 40 are illustrated in FIG. 1 as being symmetrically located across the entire surface of the body 10, it will be understood that the extensions may be randomly or irregularly spaced across the body 10. Similarly, extensions 42 extend from the P layer 16 through the N layer 20 into contact with the regions 30 and 32.

Upon inspection of FIG. 2, it will be seen that the extensions 40 provide conductive paths from the interior P-type layer 14 to the P+ regions 22 and 24. The extensions 40 are essentially terminated by the N+ regions 26 and 28. The extensions 40 thus provide shorting contact with the interior P-type layer 14 and electrodes 34 and 36 in order to provide substantially improved switching times for the device. Similarly, extensions 42 cause shorting between the interior layer 16 and the P+ region 32 and electrode 38. The shorting configurations substantially improve the commutating capability and provides much greater static dv/dt to the device. For example, a static dv/dt in excess of 1,000 volts/microsecond may be provided by the present device.

Operation of the device shown in FIGS. 1 and 2 is described in greater detail in the co-pending patent application Ser. No. 488,789. Generally, the device operates in a somewhat similar manner as a triac as far as the application of external control and gating voltages thereto, but the interior operation is substantially different. The present device includes more interior blocking junctions than are found in conventional triac devices, and thus provides substantially improved voltage capacity and other operating characteristics. An analogy of the operation of the present device is that of a conventional four layer SCR in series with a saturated NPN transistor.

The semiconductor body shown in FIGS. 1 and 2 may be formed in any suitable manner according to techniques well known in the art. For example, an N-type electrical conductivity silicon wafer may be diffused on both sides in various steps to form the five layers 12, 14, 16, 18 and 20, along with the extensions 40 and 42. The P+ and N+ regions 22–28 may be then formed in the outer portions of layer 18 by conventional diffusion techniques using suitable dopants or impurities which are compatible with the particular semiconductor material being operated upon. The regions 30 and 32 may be diffused into layer 20 in a similar manner.

The particular size and shapes of the diffused regions are, of course, determined by suitable masking and photographic techniques conventionally employed in semiconductor diffusion technology. It will be understood that any suitable semiconductor material may be utilized to form devices according to the invention, but for clarity of illustration, reference is made in the drawings to particular electrical conductivity types and to silicon as the material being utilized. It will, of course, be understood that the electrical conductivity types herein specified may be interchanged and reversed.

The present invention provides extremely good temperature characteristics. Inasmuch as most of the temperature stability of the device is controlled by the outer NPN regions of the device, the emitter efficiency of the N emitter of the device is made relatively low to provide low Beta characteristics at low current levels. The N+ regions of the device are provided to provide improved forward voltage characteristics. At low current levels, the lightly doped intermediate N-type layer appears as the emitter and the resulting Beta of the device is relatively low, thereby providing good temperature stability characteristics. At high current levels of the device, the N+ region operates as the emitter to provide good on voltage characteristics.

The device shown in FIGS. 1 and 2 in the preferred embodiment have been provided with a total thickness of approximately 8 to 12 mils, which is thicker than conventional five layer triac devices. The present devices have been found to gate at relatively low gating currents in all four quadrants. This phenomena is thought to occur due to the fact that no transverse switching currents are required for operation of the present device.

Figure 3:
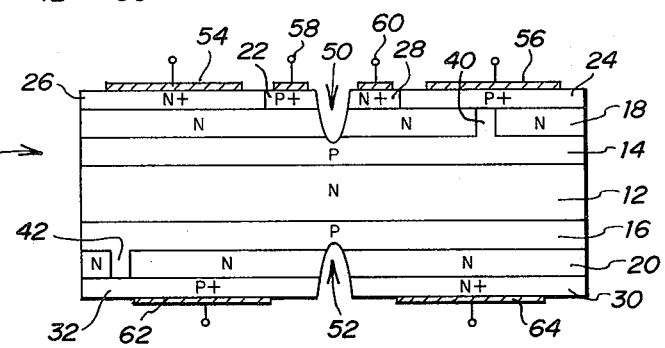
FIG. 3 is a sectional view of another embodiment of the invention.

FIG. 3 illustrates another embodiment of the present invention, with like numerals being utilized for like and corresponding parts previously described. In the embodiment shown in FIG. 3, a groove 50 is disposed between regions 22 and 28 and extend through the N-type layer 18 into the P-type layer 14. Groove 50 thus geometrically and electrically isolates the P+ region 22 and the N+ region 26 from N+ region 28 and P+ region 24. Groove 50 extends linearly completely across the body 10 of the device. Similarly, a groove 52 extends through the lower face of the body 10 and separates the P+ region 32 from the N+ region 30. Groove 52 extends through the N-type layer 20 into the P-type layer 16.

In the embodiment shown in FIG. 3, only a single extension 40 is shown which extends from the P-type layer 14 through the N-type layer 18 into contact with the P+ region 24. Extension 40 thus provides shorting contact between the interior P-type layer 14 and the exterior P+ region 24. Similarly, a single extension 42 is illustrated as extending from the interior P-type region 16 through the N-type layer 20 into contact with the P+ region 32. Extensions 40 and 42 operate to provide improved switching characteristics in the manner previously described.

An electrode 54 contacts the N+ region 26, while an electrode 56 contacts the P+ region 24. Similarly, an electrode 58 contacts the P+ region 22 while an electrode 60 contacts the N+ region 28. An electrode 62 contacts the P+ region 32, while an electrode 64 contacts the N+ region 30. The electrodes of the embodiment shown in FIG. 3 may be interconnected in the manner shown in FIG. 2 to provide a three terminal symmetrical switch. Alternatively, the electrodes illustrated in FIG. 3 may be interconnected in various other ways to accomplish different types of switching.

While the grooves 50 and 52 are illustrated as being linear in FIG. 3, it will be understood that the grooves may be provided with different configurations in order to improve switching in the various quadrants of the device. The grooves may thus be provided with the configurations illustrated in co-pending patent application Ser. No. 522,603, filed Nov. 11, 1974, by applicant and entitled "Four Quadrant Symmetrical Semiconductor Switch".

Figure 4:
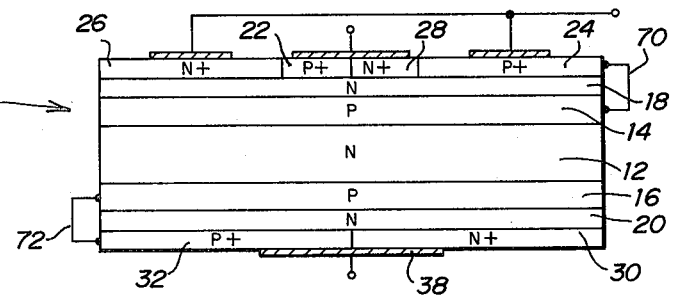
FIG. 4 is a sectional view of yet another embodiment of the invention.

FIG. 4 illustrates a device generally similar to FIG. 2, with the exception that extensions 40 and 42 have been replaced by bonded electrical wires 70 and 72. In this manner, conductive paths are formed between the interior P layer 14 and the exterior P+ region 24. Similarly, conductive paths are provided between the interior P-type layer 16 and the exterior P+ region 32. Although single wires 70 and 72 are illustrated, it will be understood that a plurality of such wires may be connected about the periphery of the device. Similarly, other conductive paths such as metalization strips may be formed to accomplish the invention.

Figure 5:
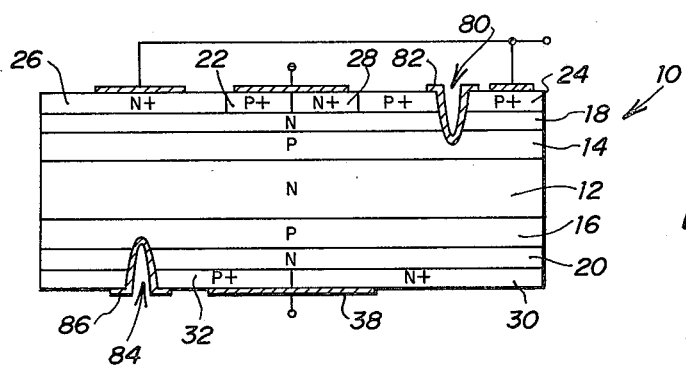
FIG. 5 is a sectional view of yet another embodiment of the invention.

FIG. 5 illustrates yet another embodiment of the present invention wherein like numerals are utilized for like and corresponding parts. In this embodiment, a groove 80 is formed through the P+ region 24 and extends through layer 18 into the P-type layer 14. A conductive metal layer 82 is formed in the groove in order to provide a conductive path between the interior P layer 14 and the exterior P+ region 24. Similarly, a groove 84 is formed through the P+ layer 32 and extends through the N-type layer 20 into the P-type layer 16. A layer of metalization 86 is formed on the groove 84 in order to provide a conductive path between the interior P-type layer 16 and the exterior P+ region 32. This conductive path provides the advantages of operation previously noted.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. In a symmetrical semiconductor switch, the combination comprising:
    a body formed from a plurality of alternating layers of first and second types of semiconductor materials, said body having interior layers and first and second outer layers each having adjacent regions of said first and second types of semiconductor material,
    first and second electrodes contacting different regions of said first outer layer and a third electrode contacting regions of said second outer layer to form a three terminal symmetrical switch,
    means for electrically connecting at least one of said regions in each said first and second outer layers with ones of said interior layers which are not immediately adjacent said outer layers, wherein the switching speed and static dv/dt and commutating capability of said switch is improved.

2. The symmetrical semiconductor switch of claim 1 wherein said means comprises:
    a plurality of extensions of said interior layers extending through the layers immediately adjacent said outer layers into contact with each of said regions.

3. The symmetrical semiconductor switch of claim 1 wherein said regions are formed from N+ type semiconductor material and from P+ type semiconductor material.

4. The symmetrical semiconductor switch of claim 1 wherein said means comprises:
    conductive paths formed from said interior layers to said regions.

5. A semiconductor switch comprising:
    a body formed from at least seven layers of alternating first and second types of semiconductor material, said body having first and second outer layers each including substantially equal size portions of said first and second conductivity material,
    a pair of regions of said first and second type of semiconductor material formed on said first outer layer, said region of said first type disposed in and surrounded by said second conductivity portion of said first outer layer and said region of said second type disposed in and surrounded by said first conductivity portion of said first outer layer,
    a first electrode contacting said regions,
    a second electrode contacting said portions of said first outer layer,
    a third electrode contacting said portions of said second outer layer, and
    extensions of said second type of semiconductor material extending from interior layers of said second type of semiconductor material through interior layers of said first type of semiconductor material into contact with said first and second outer layers.

6. The semiconductor switch of claim 5 wherein a plurality of said extensions of said second type are spaced across the surfaces of each of said outer layers.

7. The semiconductor switch of claim 5 wherein said extensions comprise narrow columns having regular cross sections.

8. The semiconductor switch of claim 5 wherein said extensions are configured to improve the commutating capability of said switch.

9. The semiconductor switch of claim 5 wherein said extensions are configured to improve the static dv/dt of said switch.

10. The semiconductor switch of claim 5 wherein said switch comprises a symmetrical operating switch.

11. The semiconductor switch of claim 5 wherein said portions and said regions are more highly doped than the interior layers.

12. The semiconductor switch of claim 5 wherein said regions and said portions are formed from N+ and P+ semiconductor material.

13. The semiconductor switch of claim 5 and further comprising:
    grooves in said first and second outer layers separating each of said portions.

* * * * *